United States Patent
He et al.

(10) Patent No.: US 12,341,444 B2
(45) Date of Patent: Jun. 24, 2025

(54) VIBRATION POWER GENERATION DEVICE

(71) Applicant: Guangzhou University, Guangdong (CN)

(72) Inventors: Yuncheng He, Guangdong (CN); Huajian Mao, Guangdong (CN); Jiyang Fu, Guangdong (CN); Jiurong Wu, Guangdong (CN); Haibo Lin, Guangdong (CN); Zhi Li, Guangdong (CN)

(73) Assignee: Guangzhou University, Guangzhou (CN)

( * ) Notice: Subject to any disclaimer, the term of this patent is extended or adjusted under 35 U.S.C. 154(b) by 848 days.

(21) Appl. No.: 17/567,070

(22) Filed: Dec. 31, 2021

(65) Prior Publication Data

US 2022/0123671 A1    Apr. 21, 2022

Related U.S. Application Data

(63) Continuation of application No. PCT/CN2020/116436, filed on Sep. 21, 2020.

(30) Foreign Application Priority Data

Jan. 8, 2020    (CN) .......................... 202010020058.8

(51) Int. Cl.
    *H02N 2/18*    (2006.01)
    *H02K 35/02*   (2006.01)

(52) U.S. Cl.
    CPC ............. *H02N 2/186* (2013.01); *H02K 35/02* (2013.01)

(58) Field of Classification Search
    CPC .......... H02N 2/18; H02N 2/186; H02N 2/188; H10N 30/304; H02K 35/02
    See application file for complete search history.

(56) References Cited

FOREIGN PATENT DOCUMENTS

| CN | 102412757 A  | 4/2012  |
|----|--------------|---------|
| CN | 103199739 A  | 7/2013  |
| CN | 203225643 U  | 10/2013 |

(Continued)

OTHER PUBLICATIONS

International Search Report of PCT Patent Application No. PCT/CN2020/116436 issued on Dec. 21, 2020.

*Primary Examiner* — J. San Martin

(57) ABSTRACT

A vibration power generation device, comprising: three power generation mechanisms with energy harvesting directions the same as three directions of three-dimensional coordinates, each of the power generation mechanisms including a piezoelectric power generation part and a magnetoelectric power generation part, wherein the piezoelectric power generation part includes two M-shaped structural beams and a first permanent magnet fixed in the middle of each of the M-shaped structural beams; and the magnetoelectric power generation part includes two magnetoelectric power generation components that are arranged on both sides of the piezoelectric power generation part and are in the same axial direction as the two first permanent magnets, and each of the magnetoelectric power generation components includes a second permanent magnet, a spring with one end connected to the second permanent magnet, a sleeve that houses the second permanent magnet in a cavity, and a coil wound on a surface of the sleeve.

8 Claims, 6 Drawing Sheets

(56) References Cited

FOREIGN PATENT DOCUMENTS

| CN | 203225644 | U |   | 10/2013 | |
|----|-----------|---|---|---------|--|
| CN | 203313087 | U |   | 11/2013 | |
| CN | 104879269 | A | * | 9/2015  | |
| CN | 106452180 | A |   | 2/2017  | |
| CN | 107302323 | A | * | 10/2017 | |
| CN | 106856380 | B | * | 9/2018  | |
| CN | 107465324 | B | * | 5/2020  | ................ H02J 7/32 |
| CN | 111490703 | A | * | 8/2020  | ............. H02N 2/186 |
| CN | 211183831 | U | * | 8/2020  | ............. H02N 2/186 |
| CN | 211481167 | U |   | 9/2020  | |
| CN | 112234860 | A | * | 1/2021  | ............. H02K 35/02 |
| CN | 111049426 | B | * | 5/2024  | ............. H02N 2/186 |
| KR | 20160074068 | A | * | 6/2016 | |

* cited by examiner

VIBRATION POWER GENERATION DEVICE

CROSS REFERENCE TO RELATED APPLICATIONS

The present application is a Continuation Application of PCT Application No. PCT/CN2020/116436 filed on Sep. 21, 2020, which claims the benefit of Chinese Patent Application No. 202010020058.8 filed on Jan. 8, 2020. All the above are hereby incorporated by reference in their entirety.

TECHNICAL FIELD

The present invention relates to the technical field of new energy and power generation, and in particular to a vibration power generation device.

BACKGROUND

In the prior art, the main mechanism of piezoelectric vibration power generation devices, such as Cymbal structure, stacked structure, cantilever beam structure and the like lies in that the energy conversion efficiency of the vibration energy harvesting system is the highest when the external vibration frequency is the same as the natural frequency of the system. However, the vibration process of the vibration source in the environment is random. Once the vibration frequency of the external environment deviates from the resonance frequency of the harvestor, the energy harvesting efficiency will be very low. Due to the single vibration beam structure of the power generating device with the above structure, the vibration frequency during energy harvesting tends to deviate from the natural frequency in the environment, and thus the energy harvesting range is small and the energy conversion efficiency is low.

SUMMARY OF THE PRESENT INVENTION

In order to solve the problems existing in the prior art, the present invention provides a vibration power generation device. A piezoelectric power generation part with an M-shaped beam structure having an adjustable angle is adopted, and a bi-stable piezoelectric-magnetoelectric composite power generation system is formed by introducing permanent magnets, so as to achieve the highest energy conversion efficiency. Mechanical energies in the X, Y, and Z directions caused by natural environmental loads and vehicle loads are harvested to increase the energy harvesting range. In addition, a stop rod is added to the device to suppress the excessive responses of the system and increase the service life of the device.

In order to achieve the above object, the present invention provides a vibration power generation device, including: three power generation mechanisms with energy harvesting directions the same as three directions of three-dimensional coordinates, each of the power generation mechanisms including a piezoelectric power generation part and a magnetoelectric power generation part, wherein the piezoelectric power generation part includes two M-shaped structural beams and a first permanent magnet fixed in the middle of each of the M-shaped structural beams; and the magnetoelectric power generation part includes two magnetoelectric power generation components that are arranged on both sides of the piezoelectric power generation part and are in the same axial direction as the two first permanent magnets, and each of the magnetoelectric power generation components includes a second permanent magnet, a spring with one end connected to the second permanent magnet, a sleeve that houses the second permanent magnet in a cavity, and a coil wound on a surface of the sleeve.

Preferably, the two magnetoelectric power generation components are symmetrical with respect to the piezoelectric power generation part.

Preferably, the piezoelectric power generation part further includes an adjustment rod fixing both ends of each of the M-shaped structural beams and a connecting rod fixing the adjustment rod.

Preferably, the piezoelectric power generation part further includes a stop rod for preventing the M-shaped structural beam from generating excessive responses.

Preferably, both ends of the M-shaped structural beam are made of piezoelectric materials.

Preferably, the M-shaped structural beam body is made of copper sheet.

Preferably, the second permanent magnet is placed on a surface of a smooth gasket.

Compared with the prior art, the technical solution of the present invention has the following beneficial effects.

1. By using an M-shaped beam structure, the vibration frequency band of the device is effectively broadened and the energy harvesting range is improved.

2. Through an adjustment rod, the angle of the M-shaped beam structure can be adjusted to the frequency band most suitable for the environmental vibration frequency.

3. Through the introduction of permanent magnets, a bi-stable system of piezoelectric-magnetoelectric composite power generation is formed, which improves the energy conversion efficiency and utilization rate.

4. Through different placement of the M-shaped beam structure and the permanent magnets, the mechanical energies of vibration in the X, Y, and Z directions on the bridge can be harvested.

5. Through the use of the piezoelectric power generation part of the double-layer M-shaped beam structure, the same poles of the permanent magnets repel each other to adjust the frequency of the device to match the environmental frequency.

6. The introduction of a stop rod can restrain the system from generating excessive response and improve the service life of the device.

DETAILED DESCRIPTION

Specific implementations of the present invention will be described in further detail below in conjunction with the accompanying drawings and embodiments. The following embodiments are intended to illustrate the present invention, rather than limiting the scope of the present invention.

Figure 1:
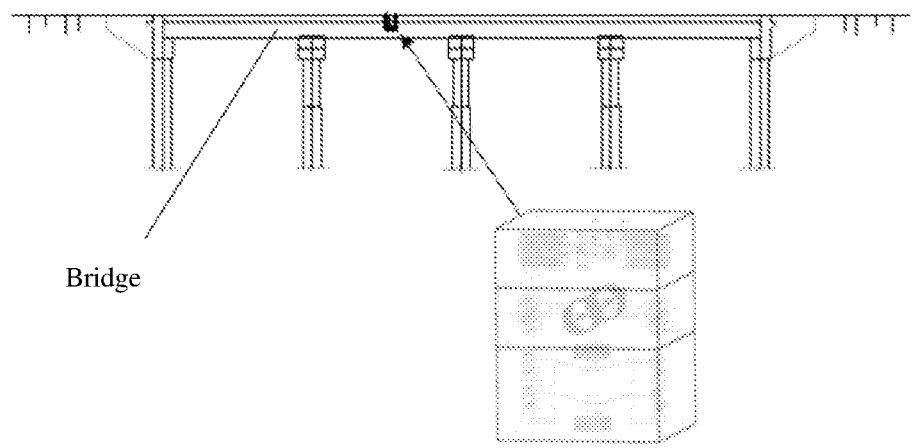
FIG. 1 is a schematic diagram of a bridge equipped with a device of the present invention.

This embodiment takes a bridge vibration power generation device shown in FIG. 1 as an example for description, and other bridge vibration power generation devices are similar to this. In the real environment, bridges are subjected to vibrations caused by loads such as the natural environment and vehicles. The resulting displacement amplitude is generally much larger than that of highways, and the directions of these vibrations are multi-directional. The device harvests the mechanical energies of the bridge vibration in the X, Y, and Z directions and converts the same into electrical energy.

Figure 2:
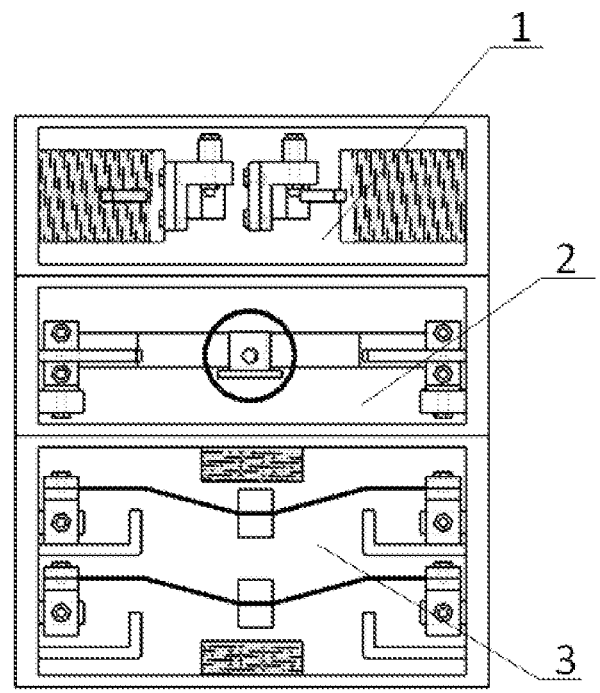
FIG. 2 is a front view of a structure of the present invention.
Figure 3:
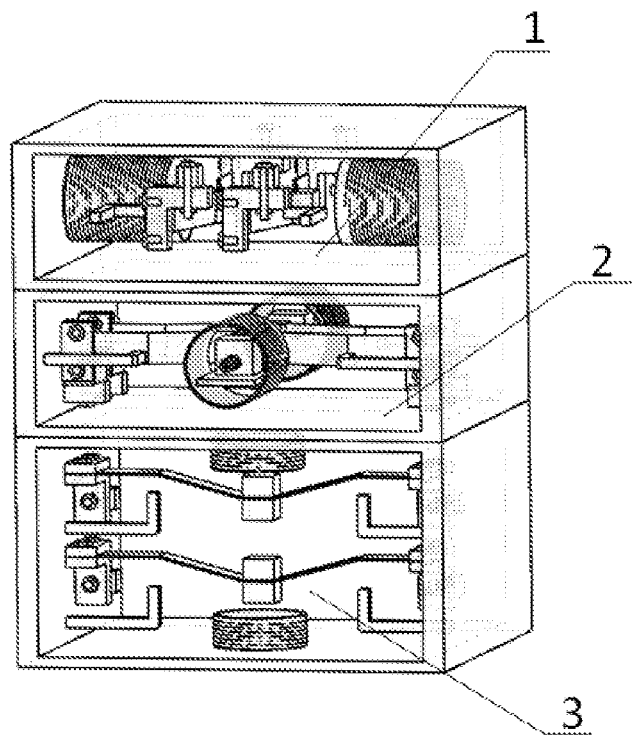
FIG. 3 is a three-dimensional view of the structure of the present invention.

A front view and a three-dimensional view of the vibration power generation device are shown in FIG. 2 and FIG. 3 respectively. The device is divided into three energy harvesting areas, which harvest vibration energy in the three directions of X, Y, and Z respectively. The top is an energy harvesting area 1 in the X direction, the middle is an energy harvesting area 2 in the Y direction, and the lowest is an energy harvesting area 3 in the Z direction. The energy harvesting area in each direction is a piezoelectric-magnetoelectric composite power generation system composed of a piezoelectric power generation part and a magnetoelectric power generation part.

Figure 4:
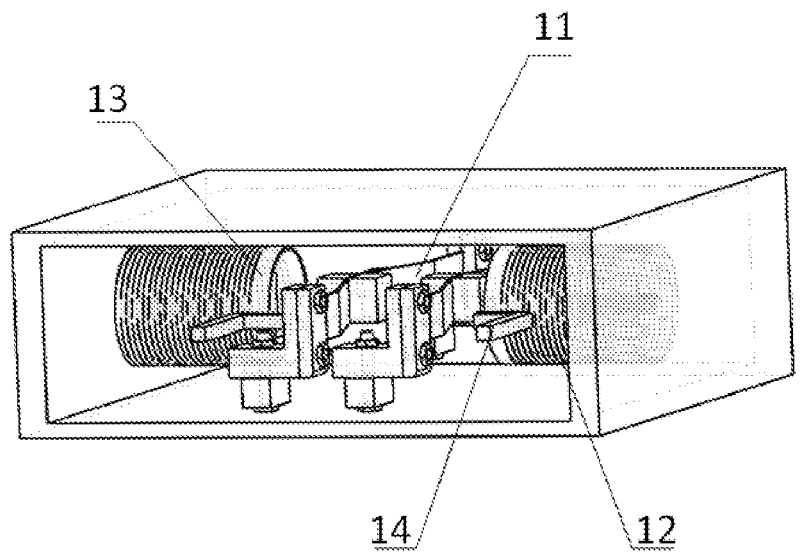
FIG. 4 is a schematic diagram of the structure of the present invention for harvesting vibration energy in the X direction.

The energy harvesting area in the X direction is shown in FIG. 4, which will be explained in conjunction with FIG. 7 and FIG. 9 below. This area harvests the vibration energy of the bridge in the X direction. The piezoelectric power generation part in this area is mainly composed of two M-shaped beam structures 11 fixed on a frame. The power generation method is that the piezoelectric material on the beam generates electricity through the vibration of the M-shaped beam. A mass in the middle of the beam structure is replaced by a first permanent magnet 111. A left end of the first permanent magnet 111 of the left M-shaped beam structure 11 is an N pole, and a right end is an S pole. A left end of the first permanent magnet 111 of the right M-shaped beam structure 11 is an S pole, and a right end is an N pole. A stop rod 14 is fixed on the left and right ends of the two M-shaped beam structures 11 respectively to restrain the M-shaped beam structure 11 from generating excessive responses. The magnetoelectric power generation part of this area is mainly composed of a second permanent magnet 15, a sleeve 13, a coil 12, a spring 16 and a smooth gasket 17. The sleeve 13 at the left and right ends, the gasket 17 and the spring 16 are fixed on the frame. The other end of the spring 16 is connected to the second permanent magnet 15. The second permanent magnet 15 is placed on the gasket 17. The sleeve 13 is sleeved on the second permanent magnet 15. The coil 12 is wound on the sleeve 13. Opposite parts of the second permanent magnet 15 on the gasket 17 and the first permanent magnet 111 on the M-shaped structural beam 110 have the same magnetic poles. Through the movement of the first permanent magnets 111 on the M-shaped structural beam 110, the same poles repel each other, thereby driving the second permanent magnet 15 on the smooth gasket 17 to move. Due to the elasticity of the spring 16, the second permanent magnet 15 on the gasket 17 will quickly return to its original position, and cut the magnetic induction lines back and forth.

Figure 5:
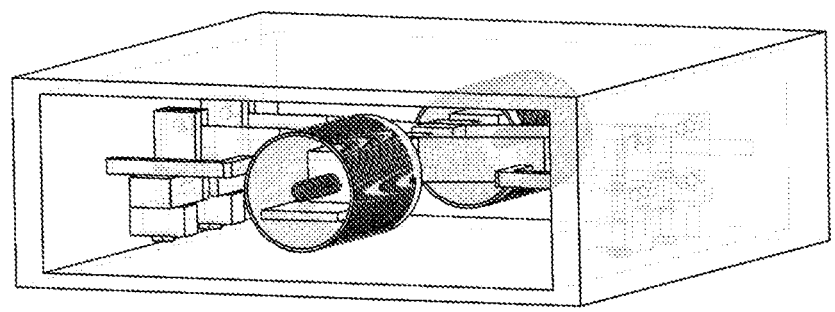
FIG. 5 is a schematic diagram of the structure of the present invention for harvesting vibration energy in the Y direction.

The energy harvesting area in the Y direction is shown in FIG. 5, and this area harvests the vibration energy of the bridge in the Y direction. The principle and components of this area are the same as those of the area in the X direction, and will not be described here.

Figure 6:
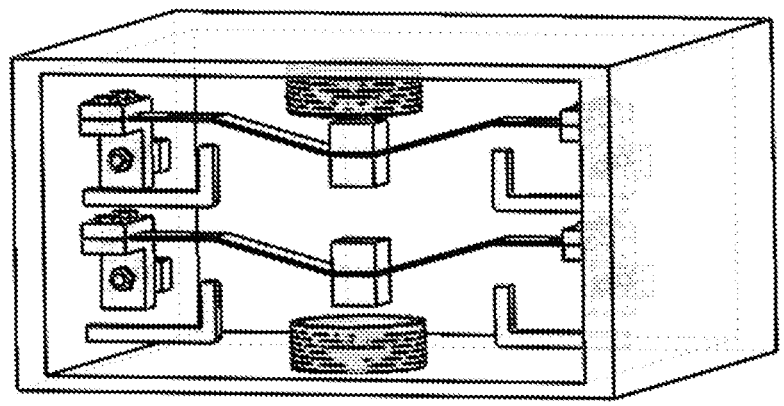
FIG. 6 is a schematic diagram of the structure of the present invention for harvesting vibration energy in the Z direction.

The energy harvesting area in the Z direction is shown in FIG. 6, and this area harvests the vibration energy of the bridge in the Z direction. The principle and components of this area are the same as those of the area in the X direction. The difference lies in that the M-shaped beam structure 11 cuts the magnetic induction lines up and down to form the magnetoelectric power generation part. The other parts will not be explained here.

Figure 7:
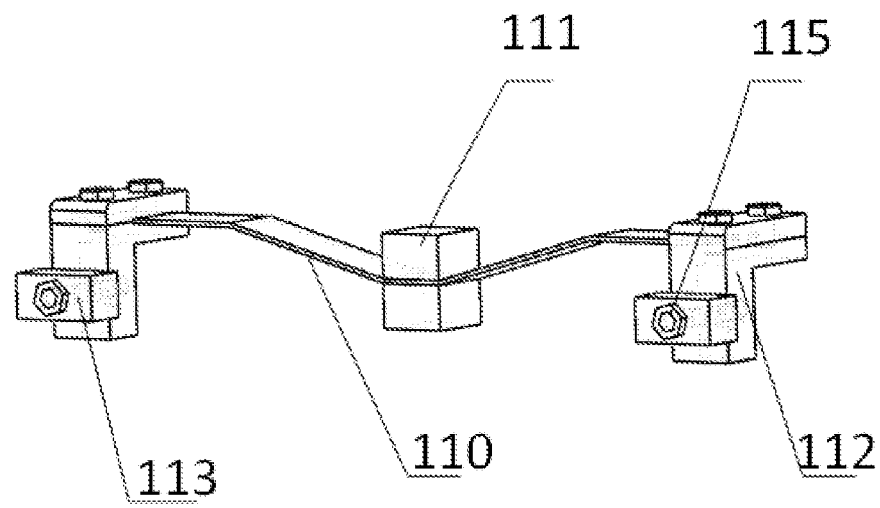
FIG. 7 is a schematic diagram of an M-shaped beam structure of the present invention.
Figure 8:
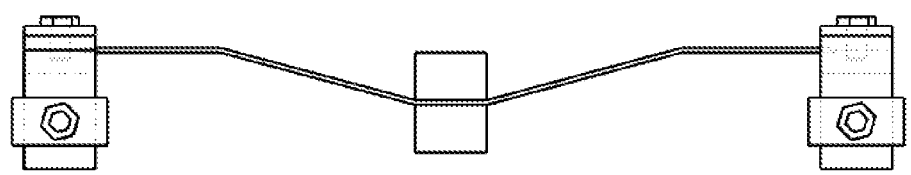
FIG. 8 is a front view of the M-shaped beam structure of the present invention.

The M-shaped beam structure 11 is shown in FIG. 7 and FIG. 8. The M-shaped structural beam 110 is connected to an adjusting rod 113 fixed on the frame through a connecting rod 112. The connecting rod 112 is rotatable around a fixed bolt 115 to adjust the angle of the M-shaped structural beam 110. The end of the M-shaped structural beam 110 is made of piezoelectric material. The body of the M-shaped structural beam 110 is made of copper sheet.

Figure 9:
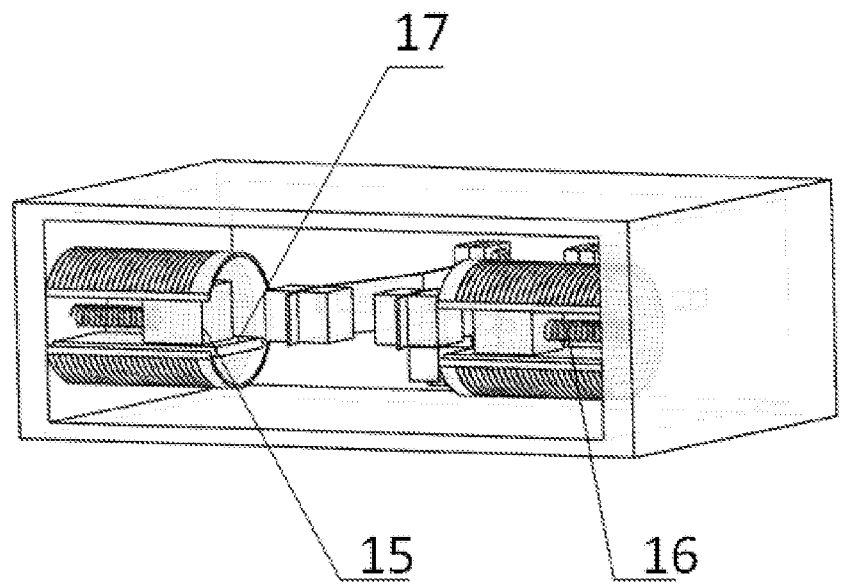
FIG. 9 is a schematic diagram of the three-dimensional structure of a magnetoelectric power generation part of the present invention in the X direction.

The magnetoelectric power generation part in the X direction is shown in FIG. 9. The sleeve 13, the spring 16 and the smooth gasket 17 are fixed on the frame. The other end of the spring 16 is connected to the second permanent magnet 15. The second permanent magnet 15 is placed on the smooth gasket 17. The sleeve 13 is sleeved on the second permanent magnet 15, the spring 16 and the smooth gasket 17. The coil 12 is wound on the sleeve 13. The movement of the M-shaped structural beam 110 drives the first permanent magnet 111 on the gasket 17 to cut the magnetic induction lines.

Figure 10:
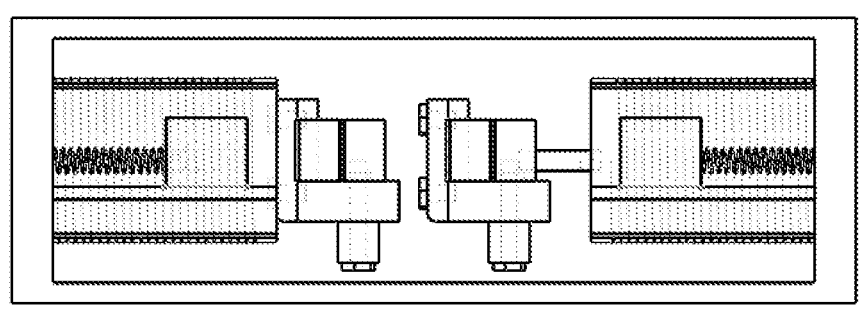
FIG. 10 is a side view of the structure of the magnetoelectric power generation part of the present invention in the Y direction.

The magnetoelectric power generation part in the Y direction is shown in FIG. 10, and the principles and components of this area are the same as those of the area in the X direction, which will not be explained here.

Figure 11:
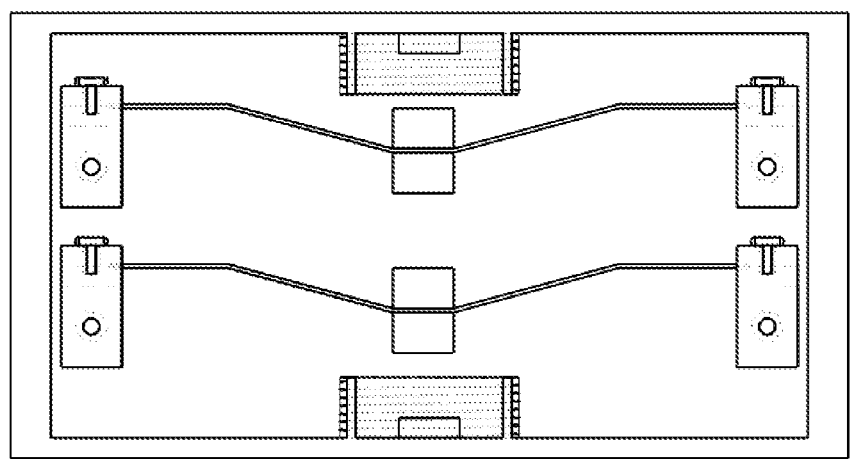
FIG. 11 is a front view of the structure of the magnetoelectric generating part of the present invention in the Z direction.

The magnetoelectric power generation part in the Z direction is shown in FIG. 11, and the principle of this area is the same as that of the area in the X direction. Compared with the area in the X direction and the area in the Y direction, the spring 16 and the gasket 17 are removed, the second permanent magnet 15 is directly fixed on the frame, and the M-shaped beam structure 11 cuts the magnetic induction lines up and down. The other parts will not be described here.

The present invention may supply power to street lamps, street sign indicators, sensors and the like on the bridge, and at the same time can save electric energy in a storage battery, so as to realize the development goals of energy saving, emission reduction and green economy.

Described above are merely preferred embodiments of the present invention. It should be noted that those ordinary skilled in the art may make several improvements and substitutions without departing from the technical principles of the present invention, and these improvements and substitutions should also be regarded as the scope of protection of the present invention.

What is claimed is:

1. A vibration power generation device, comprising: three power generation mechanisms with energy harvesting directions the same as three directions of three-dimensional coordinates, each of the power generation mechanisms comprising a piezoelectric power generation part and a magnetoelectric power generation part,
   wherein the piezoelectric power generation part comprises two M-shaped structural beams and two first permanent magnets fixed in the middle of the two M-shaped structural beams respectively;
   wherein the magnetoelectric power generation part comprises two magnetoelectric power generation components that are arranged on both sides of the piezoelectric power generation part and are in the same axial direction as the two first permanent magnets, and each of the magnetoelectric power generation components comprises a second permanent magnet, a sleeve that houses the second permanent magnet in a cavity, and a coil wound on a surface of the sleeve; and
   wherein the three power generation mechanisms comprises an X-direction power generation mechanism, a Y-direction power generation mechanism, and a Z-direction power generation mechanism, and each of the magnetoelectric power generation components of the X-direction power generation mechanism and the Y-direction power generation mechanism further comprises a spring with one end connected to the second permanent magnet.

2. The vibration power generation device according to claim 1, wherein the two magnetoelectric power generation components are symmetrical with respect to the piezoelectric power generation part.

3. The vibration power generation device according to claim 1, wherein the piezoelectric power generation part further comprises an adjustment rod fixing both ends of each of the M-shaped structural beams and a connecting rod fixing the adjustment rod.

4. The vibration power generation device according to claim 1, wherein the piezoelectric power generation part further comprises a stop rod for preventing the M-shaped structural beam from generating excessive responses.

5. The vibration power generation device according to claim 1, wherein both ends of the M-shaped structural beam are made of piezoelectric materials.

6. The vibration power generation device according to claim 1, wherein the main body of the M-shaped structural beam is made of copper sheet.

7. The vibration power generation device according to claim 1, wherein the second permanent magnet of the X-direction power generation mechanism and the Y-direction power generation mechanism is placed on a surface of a smooth gasket.

8. The vibration power generation device according to claim 1, wherein the second permanent magnet of the Z-direction power generation mechanism is directly fixed on a frame of the vibration power generation device.

* * * * *